United States Patent
Masleid et al.

(10) Patent No.: US 8,904,254 B2
(45) Date of Patent: Dec. 2, 2014

(54) COMBO DYNAMIC FLOP WITH SCAN

(71) Applicant: Oracle International Corporation, Redwood Shores, CA (US)

(72) Inventors: Robert P. Masleid, Monte Sereno, CA (US); Ali Vahidsafa, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 75 days.

(21) Appl. No.: 13/673,503

(22) Filed: Nov. 9, 2012

(65) Prior Publication Data

US 2014/0136912 A1 May 15, 2014

(51) Int. Cl.
*G01R 31/28* (2006.01)

(52) U.S. Cl.
USPC ........................................ 714/727; 714/731

(58) Field of Classification Search
CPC ................ G01R 31/318541; G01R 31/31704; G01R 31/318552
USPC ........... 714/718, 726, 729, 731, 727; 327/200
See application file for complete search history.

(56) References Cited

U.S. PATENT DOCUMENTS

| | | | | | |
|---|---|---|---|---|---|
| 4,554,664 | A | * | 11/1985 | Schultz | 714/726 |
| 6,032,278 | A | * | 2/2000 | Parvathala et al. | 714/726 |
| 6,667,645 | B1 | * | 12/2003 | Fletcher et al. | 327/200 |
| 6,954,887 | B2 | * | 10/2005 | Wang et al. | 714/729 |
| 2007/0162802 | A1 | * | 7/2007 | Miwa | 714/726 |
| 2011/0072326 | A1 | * | 3/2011 | Vahidsafa et al. | 714/731 |

* cited by examiner

*Primary Examiner* — David Ton
(74) *Attorney, Agent, or Firm* — Osha Liang LLP

(57) ABSTRACT

A combo dynamic flop with scan flop circuit includes a flip-flop circuit, a scan control circuit, and an output buffer circuit. The flip-flop circuit includes a dynamic latch circuit and a static latch circuit. The dynamic latch circuit includes a dynamic latch storage node. The static latch circuit includes a static storage node driven by the dynamic latch. The scan control circuit includes a scan slave feed-forward circuit, a scan latch circuit, and a scan driver circuit driven by the scan feed-back circuit. The scan latch circuit includes a scan feed-back circuit, a scan storage node, and a scan feed-forward circuit driven from the static latch. The output buffer circuit includes a dynamic latch driver driven from the dynamic latch circuit and a static driver driven from the static latch circuit.

14 Claims, 4 Drawing Sheets

COMBO DYNAMIC FLOP WITH SCAN

BACKGROUND OF INVENTION

Flip-flops are widely used state elements that hold a particular state for a full clock cycle. A flip-flop consists of two latches connected serially, a master latch and a slave latch. The slave latch provides the flip-flop output. Thus, a scan function for test capability is provided by integrating a scan latch with the slave latch of flip-flop. In both a user mode and a test mode of operation, however, the output of master latch remains internal to the flip-flop.

SUMMARY OF INVENTION

In one or more embodiments, the present invention relates to a combo dynamic flop with scan circuit, driven by a source clock signal, comprising: a flip-flop circuit comprising: a dynamic latch circuit comprising: a dynamic latch storage node, and a static latch circuit comprising: a static storage node, and wherein the static latch is operatively driven from the dynamic latch, wherein the scan clock provides a control signal for writing to the static storage node, wherein the dynamic latch and static latch are written simultaneously, and wherein the dynamic latch is precharged while scan data is preserved in the static latch until a next clock cycle, a scan control circuit comprising: a scan slave feed-forward circuit providing a control signal for writing scan data to the static storage node, a scan latch circuit comprising: a scan feed-back circuit comprising a scan storage node, a scan feed-forward circuit operatively driven from the static latch, wherein the scan feed-forward circuit provides control signal for writing to the scan storage node, and a scan driver, with a scan output port, operatively driven by the scan feed-back circuit, and an output buffer circuit comprising: a dynamic latch driver, with a dynamic latch output port, operatively driven from the dynamic latch, and a static driver, with a static output port, operatively driven from the static latch.

In one or more embodiments, the present invention relates to a semiconductor device comprising: a mechanical package; and a semiconductor die comprising: a semiconductor layer, a plurality of metal layers, a clock distribution network that distributes a clock signal within the die, and a combo dynamic flop with scan circuit, driven by a source clock signal, comprising: a flip-flop circuit comprising: a dynamic latch circuit comprising: a dynamic latch storage node, and a static latch circuit comprising: a static storage node, and wherein the static latch is operatively driven from the dynamic latch, wherein the scan clock provides a control signal for writing to the static storage node, wherein the dynamic latch and static latch are written simultaneously, and wherein the dynamic latch is precharged while scan data is preserved in the static latch until a next clock cycle, a scan control circuit comprising: a scan slave feed-forward circuit providing a control signal for writing scan data to the static storage node, a scan latch circuit comprising: a scan feed-back circuit comprising a scan storage node, a scan feed-forward circuit operatively driven from the static latch, wherein the scan feed-forward circuit provides control signal for writing to the scan storage node, and a scan driver, with a scan output port, operatively driven by the scan feed-back circuit, and an output buffer circuit comprising: a dynamic latch driver, with a dynamic latch output port, operatively driven from the dynamic latch, and a static driver, with a static output port, operatively driven from the static latch.

In one or more embodiments, the present invention relates to a system comprising: an input device; an output device; a mechanical chassis; a printed circuit board; and a semiconductor device comprising: a mechanical package; and a semiconductor die comprising: a semiconductor layer, a plurality of metal layers, a clock distribution network that distributes a clock signal within the die, and a combo dynamic flop with scan circuit, driven by a source clock signal, comprising: a flip-flop circuit comprising: a dynamic latch circuit comprising: a dynamic latch storage node, and a static latch circuit comprising: a static storage node, and wherein the static latch is operatively driven from the dynamic latch, wherein the scan clock provides a control signal for writing to the static storage node, wherein the dynamic latch and static latch are written simultaneously, and wherein the dynamic latch is precharged while scan data is preserved in the static latch until a next clock cycle, a scan control circuit comprising: a scan slave feed-forward circuit providing a control signal for writing scan data to the static storage node, a scan latch circuit comprising: a scan feed-back circuit comprising a scan storage node, a scan feed-forward circuit operatively driven from the static latch, wherein the scan feed-forward circuit provides control signal for writing to the scan storage node, and a scan driver, with a scan output port, operatively driven by the scan feed-back circuit, and an output buffer circuit comprising: a dynamic latch driver, with a dynamic latch output port, operatively driven from the dynamic latch, and a static driver, with a static output port, operatively driven from the static latch.

DETAILED DESCRIPTION

Figure 1:
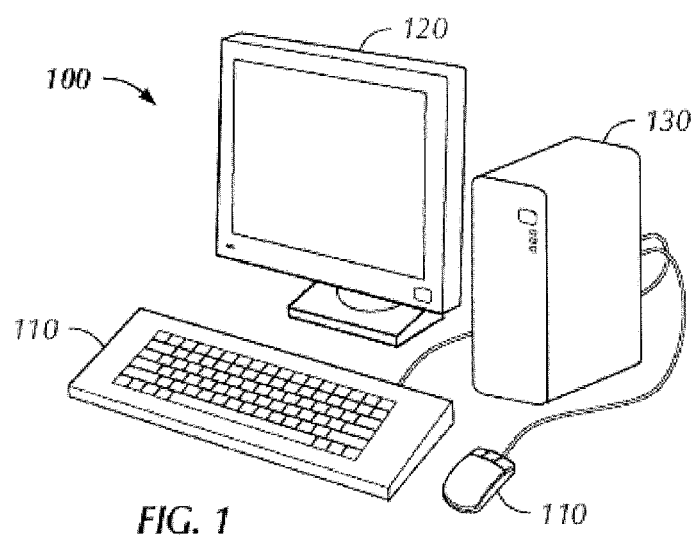
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes input devices 110, an output device 120, and a mechanical chassis 130. The mechanical chassis 130 includes a printed circuit board ("PCB"), a network device, and a storage device (not shown).

Figure 2:
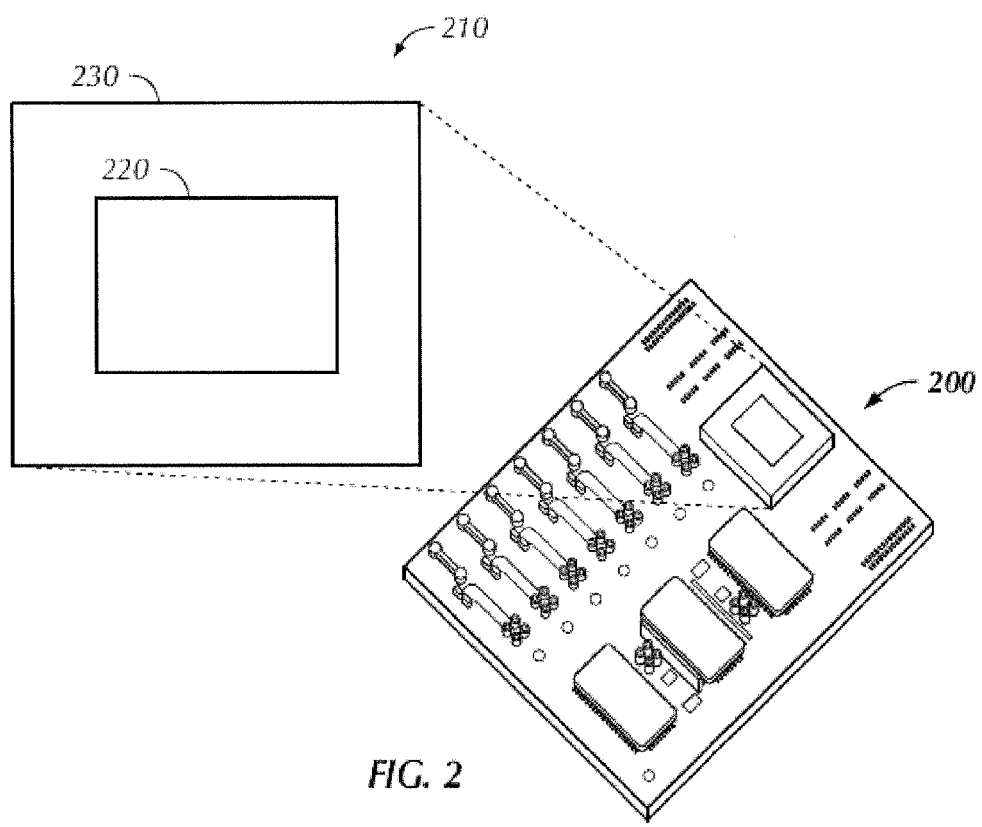
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each includes one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 210. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes clock routes to the individual clock users via a clock grid. The local layer includes clock routes to the actual flip-flops.

A typical flip-flop has slave latch output as the flip-flop output, whereas master latch output stays inside the flip-flop. The special testing requirement of combo dynamic flop with scan requires that dynamic latch output be available outside the flip-flop. Thus, a flip-flop for special combo dynamic flop with scan testing has two outputs, the static latch output for testing and the dynamic latch output for user operation.

Figure 3:
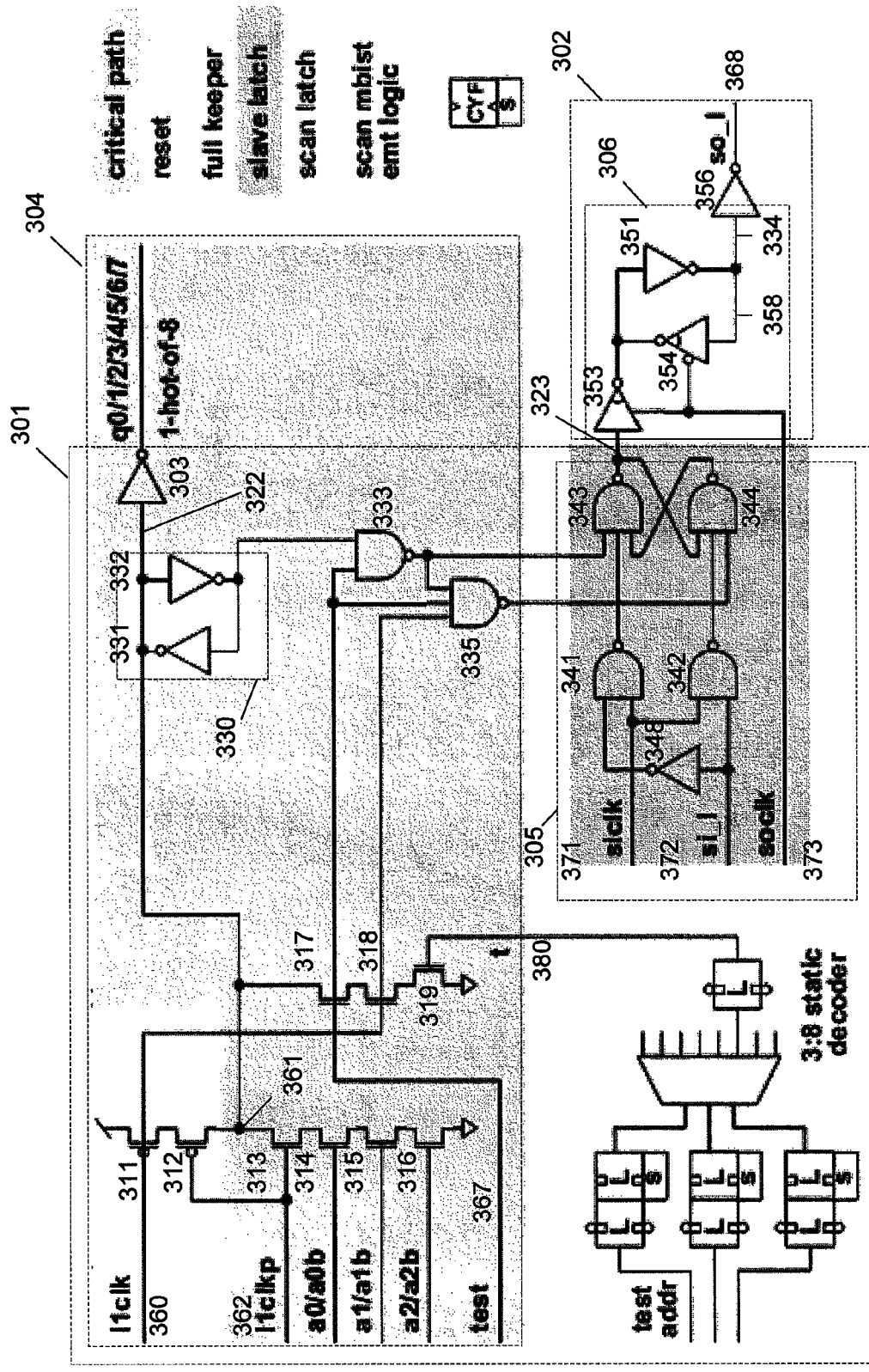
FIG. 3 shows a first combo dynamic flop with scan in accordance with one or more embodiments of the present invention.

FIG. 3 shows a first combo dynamic flop with scan 300 in accordance with one or more embodiments of the present invention. The first combo dynamic flop with scan 300 consists of three major blocks, dynamic latch 304, scan control 302, and static latch 305. The output from the dynamic latch 304 is fed to the dynamic latch driver 322. The dynamic latch driver 322 feeds output buffer 303 as the output from the flip-flop.

The flip-flop 301 is driven by clock signals, L1CLK 360 and L1CLKP 362, and a data-in signal, D 361. The data signal, D 361, comprises inputs A0, A1, and A2. The flip-flop is comprised of n-channel field effect transistors ("N-FETs"), p-channel field effect transistors ('P-FETs"), NAND gates, and inverters. The flip-flop 301 consists of two main components, a dynamic latch 304 and a static latch 305. Additionally, the flip-flop also has a Test clock 367.

The dynamic latch 304 comprises P-FET 311, P-FET 312, N-FET 313, N-FET 314, N-FET 315, N-FET 316, N-FET 317, N-FET 318, N-FET 319, NAND 333, and NAND 335. The output of the dynamic latch 304 is fed to output buffer 303. The dynamic latch further comprises driver 322 having keeper devices 330 comprising inverter 331 and inverter 332. The dynamic latch further comprises NAND 333 and NAND 335 for feeding the static latch 305.

The static latch 305 comprises NAND 341, NAND 342, NAND 343, NAND 344, and inverter 348. The output of the static latch 305 is fed to the static driver 323. The static latch has inputs SICLK 371, SI_L 372, and SOCLK 373.

The scan control 302 is integrated with flip-flop 301 for test capability. The scan control 302 comprises scan latch 306 and scan driver 356. The scan latch comprises inverter 351, tri-state inverter 353, and tri-state inverter 354. The scan storage node 358 drives the input of scan driver 356, where the output of scan driver 356 is scan out signal SO 368. The SO 368 signal is available outside the first combo dynamic flop with scan 300 for test mode. The combo dynamic flop testing requires that test data (e.g., scan data) be loaded into static latch 305 of flip-flop 301. This is accomplished in 2 steps, scan-in step to load scan data to static latch 305 and scan-out step to transfer the data loaded into static latch 305 to scan latch 306.

The dynamic latch 304 has three modes of operation, a transparent mode, a hold mode, and a precharge mode. In the transparent mode, L1CLK 360 is at a high logic state and data-in signal at D 361 is transmitted through the dynamic latch 304 to the output of dynamic latch 304. The output 322 is the output from dynamic latch 304 of the flip-flop 301.

In the transparent mode of dynamic latch 304, P-FET 311 is disabled with L1CLK 360 at a high logic state and L1CLKP 362 at a pulse high logic state. It is well known in the art that P-FET is disabled with a high logic state on the gate of P-FET. The N-FET 314, N-FET 315, or N-FET 316, are enabled for the case of data-in A0, A1, or A2 respectively at high logic state. Under these conditions of L1CLK 360 at high logic state and either of D0, D1, or D2 at high logic state, a low logic state is written by a pull-down path to ground through N-FET 313, N-FET 314, N-FET 315, and N-FET 316. During a subsequent hold phase of the clock, L1CLK 360 is at a high logic state and L1CLKP 362 has ended its high logic state pulse and switched to a low logic state. During this dynamic latch hold mode, both P-FET stack (P-FET 311 and P-FET 312) and N-FET stack (N-FET 313, N-FET 314, N-FET 315, and N-FET 316) are off and keeper 330 maintains the state of the dynamic latch. During a subsequent precharge phase with L1CLK 360 at a low logic state, the previously written state will be precharged and with either of D0, D1, or D2 at high logic state, a high logic state is written by a pull-up path to Vdd through P-FET 311 and P-FET 312.

Further, the static latch 305 has three modes of operation: a hold mode, a scan transparent mode, and a functional transparent mode.

In the hold mode, SICLK 371 is at a low logic state, NAND 341 and NAND 342 are inactive, so the static latch 305 maintains the previously written state. Further, when L1CLK 360 is at low logic state, dynamic latch output 322 is precharged high, and NAND 333 and NAND 335 are inactive so the static latch maintains the previously written state.

In the scan transparent mode, L1CLK 360 is at a low logic state and SICLK 371 is at a high logic state, such that NAND 341 and NAND 342 are active and data from SI_L 372 is transmitted through static latch 305 to the output of static latch 305.

In the functional transparent mode, SICLK 371 is at a low logic state, L1CLK 360 is at a high logic state, and NAND 333 and NAND 335 are active, such that data from the dynamic latch 304 is transmitted through the static latch 305 to the output of static latch 305.

The flip-flop 301 can now be described based upon the dynamic latch 304 and static latch 305 described above. During L1CLK 360 at a high logic state and L1CLKP 362 at pulse high logic state, data-in at D 361 is written to the dynamic latch 304 and static latch 305 with SICLK 371 in high logic state, static latch 305 is in test transparent mode and data from SI_L 372 is transmitted through static latch 305 and static driver 323. During a later clock phase with L1CLK 360 at low logic state, dynamic latch 304 will be in precharge mode and the dynamic latch data erased. The static output data at static driver 323 may change once every cycle, on a low to high transition edge of the clock L1CLK 360 and L1CLKP 362. An at-speed test may be run with test port T 380. The test input logic can write both the dynamic latch 304 and the static latch 305.

It will be obvious to those skilled in the art, that other embodiments can be easily derived with output data changing on a high to low transition edge of the clock. Accordingly, the specific arrangement of components shown in FIG. 3 should be considered as merely one example of an embodiment of the present invention.

Figure 4:
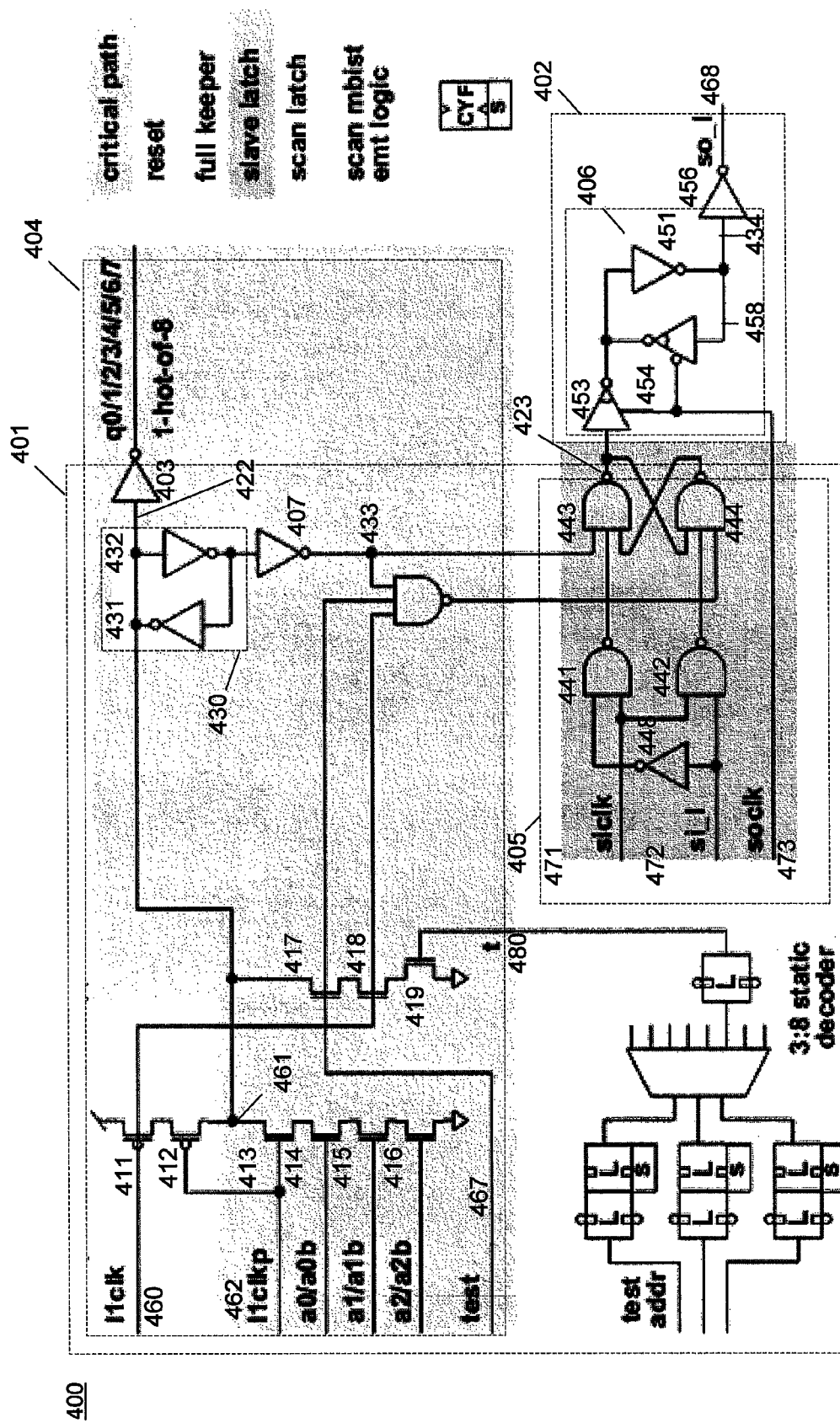
FIG. 4 shows a second combo dynamic flop with scan in accordance with one or more embodiments of the present invention.

FIG. 4 shows a first combo dynamic flop with scan 400 in accordance with one or more embodiments of the present invention. The first combo dynamic flop with scan 400 consists of three major blocks, dynamic latch 404, scan control 402, and static latch 405. The output from the dynamic latch 404 is fed to the dynamic latch driver 422. The dynamic latch driver 422 feeds inverter 407 and output buffer 403 as the output from the flip-flop.

The flip-flop 401 is driven by clock signals, L1CLK 460 and L1CLKP 462, and a data-in signal, D 461. The data signal, D 461, comprises inputs A0, A1, and A2. The flip-flop is comprised of n-channel field effect transistors ("N-FETs"), p-channel field effect transistors ('P-FETs"), NAND gates, and inverters. The flip-flop 401 consists of two main components, a dynamic latch 404 and a static latch 405. Additionally, the flip-flop also has a Test clock 467.

The dynamic latch 404 comprises P-FET 411, P-FET 412, N-FET 413, N-FET 414, N-FET 415, N-FET 416, N-FET 417, N-FET 418, N-FET 419, NAND 433, and inverter 407. The output of the dynamic latch 404 is fed to output buffer 403. The dynamic latch further comprises driver 422 having keeper devices 430 comprising inverter 431 and inverter 432. The dynamic latch further comprises NAND 433 and inverter 407 for feeding the static latch 405.

The static latch 405 comprises NAND 441, NAND 442, NAND 443, NAND 444, and inverter 448. The output of the static latch 405 is fed to the static driver 423. The static latch has inputs SICLK 471, SI_L 472, and SOCLK 473.

The scan control 402 is integrated with flip-flop 401 for test capability. The scan control 402 comprises scan latch 406 and scan driver 456. The scan latch comprises inverter 451, tri-state inverter 453, and tri-state inverter 454. The scan storage node 458 drives the input of scan driver 456, where the output of scan driver 456 is scan out signal SO 468. The SO 468 signal is available outside the first combo dynamic flop with scan 400 for test mode. The combo dynamic flop testing requires that test data (e.g., scan data) be loaded into static latch 405 of flip-flop 401. This is accomplished in 2 steps, scan-in step to load scan data to static latch 405 and scan-out step to transfer the data loaded into static latch 405 to scan latch 406.

The dynamic latch 404 has three modes of operation, a transparent mode, a hold mode, and a precharge mode. In the transparent mode, L1CLK 460 is at a high logic state and data-in signal at D 461 is transmitted through the dynamic latch 404 to the output of dynamic latch 404. The output 422 is the output from dynamic latch 404 of the flip-flop 401.

In the transparent mode of dynamic latch 404, P-FET 411 is disabled with L1CLK 460 at a high logic state and L1CLKP 462 at a pulse high logic state. It is well known in the art that P-FET is disabled with a high logic state on the gate of P-FET. The N-FET 414, N-FET 415, or N-FET 416, are enabled for the case of data-in A0, A1, or A2 respectively at high logic state. Under these conditions of L1CLK 460 at high logic state and either of D0, D1, or D2 at high logic state, a low logic state is written by a pull-down path to ground through N-FET 413, N-FET 414, N-FET 415, and N-FET 416. During a subsequent hold phase of the clock, L1CLK 460 is at a high logic state and L1CLKP 462 has ended its high logic state pulse and switched to a low logic state. During this dynamic latch hold mode, both P-FET stack (P-FET 411 and P-FET 412) and N-FET stack (N-FET 413, N-FET 414, N-FET 415, and N-FET 416) are off and keeper 430 maintains the state of the dynamic latch. During a subsequent precharge phase with L1CLK 460 at a low logic state, the previously written state will be precharged and with either of D0, D1, or D2 at high logic state, a high logic state is written by a pull-up path to Vdd through P-FET 411 and P-FET 412.

Further, the static latch 405 has three modes of operation: a hold mode, a scan transparent mode, and a functional transparent mode.

In the hold mode, SICLK 471 is at a low logic state, NAND 441 and NAND 442 are inactive, so the static latch 405 maintains the previously written state. Further, when L1CLK 460 is at low logic state, dynamic latch output 422 is precharged high, and NAND 433 is inactive so the static latch maintains the previously written state.

In the scan transparent mode, L1CLK 460 is at a low logic state and SICLK 471 is at a high logic state, such that NAND 441 and NAND 442 are active and data from SI_L 472 is transmitted through static latch 405 to the output of static latch 405.

In the functional transparent mode, SICLK 471 is at a low logic state, L1CLK 460 is at a high logic state, and NAND 433 is active, such that data from the dynamic latch 404 is transmitted through the static latch 405 to the output of static latch 405.

The flip-flop 401 can now be described based upon the dynamic latch 404 and static latch 405 described above. During L1CLK 460 at a high logic state and L1CLKP 462 at pulse high logic state, data-in at D 461 is written to the dynamic latch 404 and static latch 405 with SICLK 471 in high logic state, static latch 405 is in test transparent mode and data from SI_L 472 is transmitted through static latch 405 and static driver 423. During a later clock phase with L1CLK 460 at low logic state, dynamic latch 404 will be in precharge mode and the dynamic latch data erased. The static output data at static driver 423 may change once every cycle, on a low to high transition edge of the clock L1CLK 460 and L1CLKP 462. An at-speed test may be run with test port T 480. The test input logic can write both the dynamic latch 404 and the static latch 405. Accordingly, the specific arrangement of components shown in FIG. 4 should be considered as merely one example of an embodiment of the present invention.

Figure 5:
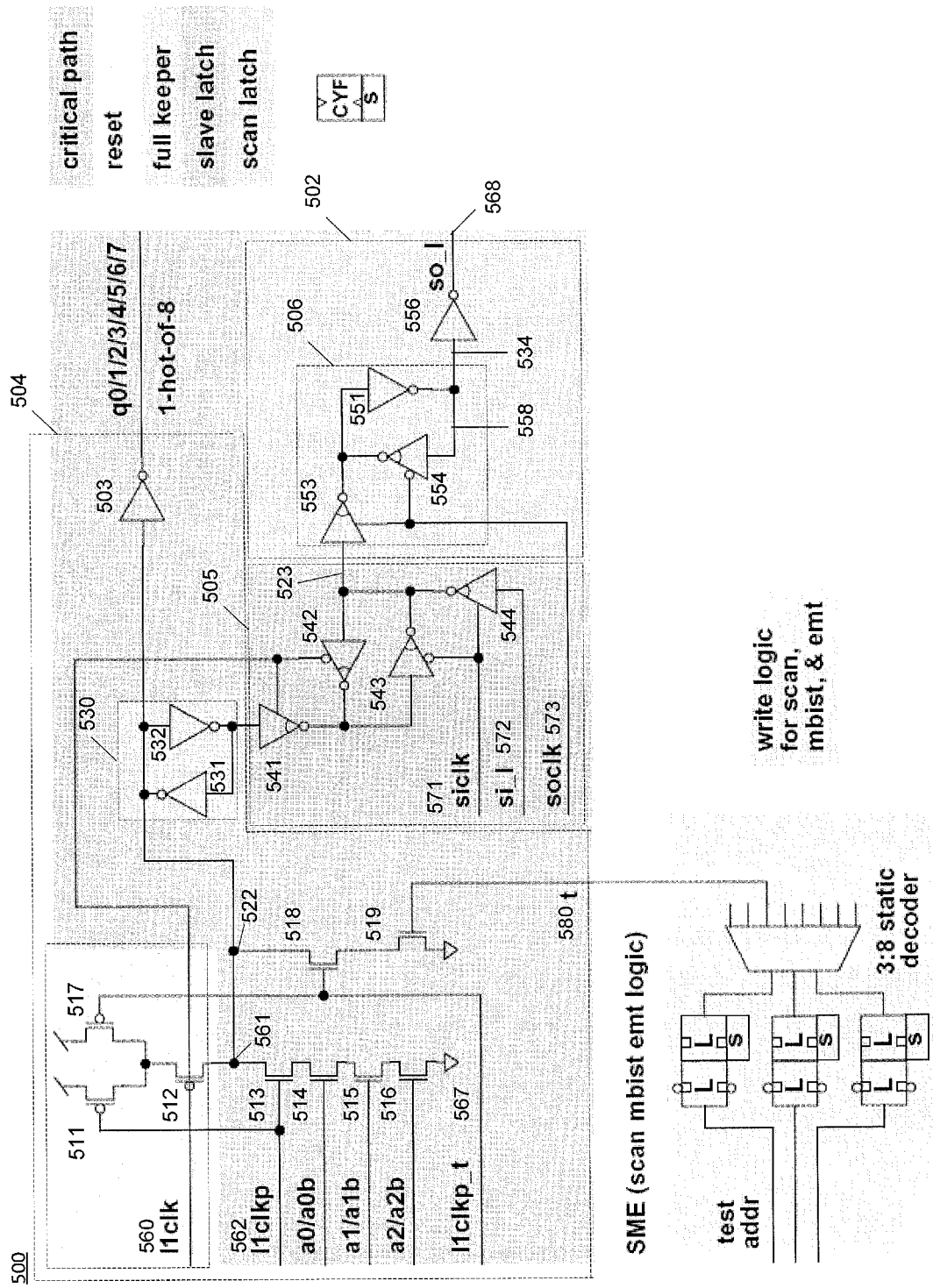
FIG. 5 shows a third combo dynamic flop with scan in accordance with one or more embodiments of the present invention.

FIG. 5 shows a first combo dynamic flop with scan 500 in accordance with one or more embodiments of the present invention. The first combo dynamic flop with scan 500 consists of three major blocks, dynamic flop 504, scan control 502, and static latch 505. The output from the dynamic latch 504 is fed to the dynamic latch driver 522. The dynamic latch driver 522 feeds output buffer 503 as the output from the flip-flop.

The flip-flop 501 is driven by clock signals, L1CLK 560 and L1CLKP 562, and a data-in signal, D 561. The data signal, D 561, comprises inputs A0, A1, and A2. The flip-flop is comprised of n-channel field effect transistors ("N-FETs"), p-channel field effect transistors ('P-FETs"), tri-state inverters, and inverters. The flip-flop 501 consists of two main components, a dynamic latch 504 and a static latch 505. Additionally, the flip-flop also has a Test clock 567.

The dynamic latch 504 comprises P-FET 511, P-FET 512, N-FET 513, N-FET 514, N-FET 515, N-FET 516, P-FET 517, N-FET 518, and N-FET 519. The output of the dynamic latch 504 is fed to output buffer 503. The dynamic latch further comprises driver 522 having keeper devices 530 comprising inverter 531 and inverter 532.

The static latch 505 comprises tri-state inverter 541, tri-state inverter 542, tri-state inverter 543, and tri-state inverter 544. The output of the static latch 505 is fed to the static driver 523. The static latch has inputs SICLK 571, SI_L 572, and SOCLK 573.

The scan control 502 is integrated with flip-flop 501 for test capability. The scan control 502 comprises scan latch 506 and scan driver 556. The scan latch comprises inverter 551, tri-state inverter 553, and tri-state inverter 554. The scan storage node 558 drives the input of scan driver 556, where the output of scan driver 556 is scan out signal SO 568. The SO 568 signal is available outside the first combo dynamic flop with scan 500 for test mode. The combo dynamic flop testing requires that test data (e.g., scan data) be loaded into static latch 505 of flip-flop 501. This is accomplished in 2 steps, scan-in step to load scan data to static latch 505 and scan-out step to transfer the data loaded into static latch 505 to scan latch 506.

The dynamic latch 504 has three modes of operation, a transparent mode, a hold mode and a precharge mode. In the transparent mode, L1CLK 560 is at a high logic state and data-in signal at D 561 is transmitted through the dynamic latch 504 to the output of dynamic latch 504. The output 522 is the output from dynamic latch 504 of the flip-flop 501.

In the transparent mode of dynamic latch 504, P-FET 511 is disabled with L1CLK 560 at a high logic state and L1CLKP 562 at a pulse high logic state. It is well known in the art that P-FET is disabled with a high logic state on the gate of P-FET. The N-FET 514, N-FET 515, or N-FET 516, are enabled for the case of data-in A0, A1, or A2 respectively at high logic state. Under these conditions of L1CLK 560 at high logic state and either of D0, D1, or D2 at high logic state, a low logic state is written by a pull-down path to ground through N-FET 513, N-FET 514, N-FET 515, and N-FET 516. During a subsequent hold phase of the clock, L1CLK 560 is at a high logic state and L1CLKP 562 has ended its high logic state pulse and switched to a low logic state. During this dynamic latch hold mode, both P-FET stack (P-FET 511, P-FET 512, and P-FET 517) and N-FET stack (N-FET 513, N-FET 514, N-FET 515, and N-FET 516) are off and keeper 530 maintains the state of the dynamic latch. During a subsequent precharge phase with L1CLK 560 at a low logic state, the previously written state will be precharged and with either of D0, D1, or D2 at high logic state, a high logic state is written by a pull-up path to Vdd through P-FET 511 and P-FET 512.

Further, the static latch 505 has three modes of operation: a hold mode, a scan transparent mode, and a functional transparent mode.

In the hold mode, SICLK 571 is at a low logic state, tri-state inverter 544 is inactive, so the static latch 505 maintains the previously written state. Further, when L1CLK 560 is at low logic state, dynamic latch output 522 is precharged high, and the static latch maintains the previously written state.

In the scan transparent mode, L1CLK 560 is at a low logic state and SICLK 571 is at a high logic state, such that tri-state inverter 544 and tri-state inverter 542 are active and data from SI_L 572 is transmitted through static latch 505 to the output of static latch 505.

In the functional transparent mode, SICLK 571 is at a low logic state and L1CLK 560 is at a high logic state, such that data from the dynamic latch 504 is transmitted through the static latch 505 to the output of static latch 505.

The flip-flop 501 can now be described based upon the dynamic latch 504 and static latch 505 described above. During L1CLK 560 at a high logic state and L1CLKP 562 at pulse high logic state, data-in at D 561 is written to the dynamic latch 504 and static latch 505 with SICLK 571 in high logic state, static latch 505 is in test transparent mode and data from SI_L 572 is transmitted through static latch 505 and static driver 523. During a later clock phase with L1CLK 560 at low logic state, dynamic latch 504 will be in precharge mode and the dynamic latch data erased. The static output data at static driver 523 may change once every cycle, on a low to high transition edge of the clock L1CLK 560 and L1CLKP 562. An at-speed test may be run with test port T 580. The test input logic can write both the dynamic latch 504 and the static latch 505. Accordingly, the specific arrangement of components shown in FIG. 5 should be considered as merely one example of an embodiment of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A combo dynamic flop with scan circuit, driven by a source clock signal, comprising:
a flip-flop circuit comprising:
a dynamic latch circuit comprising:
a dynamic latch storage node, and
a static latch circuit comprising:
a static storage node, and
wherein the static latch is operatively driven from the dynamic latch,
wherein a scan clock provides a control signal for writing to the static storage node,
wherein the dynamic latch and static latch are written simultaneously, and
wherein the dynamic latch is precharged while scan data is preserved in the static latch until a next clock cycle,
a scan control circuit comprising:
a scan slave feed-forward circuit providing a control signal for writing scan data to the static storage node,
a scan latch circuit comprising:
a scan feed-back circuit comprising a scan storage node,
a scan feed-forward circuit operatively driven from the static latch, wherein the scan feed-forward circuit provides control signal for writing to the scan storage node, and
a scan driver, with a scan output port, operatively driven by the scan feed-back circuit, and
an output buffer circuit comprising:
a dynamic latch driver, with a dynamic latch output port, operatively driven from the dynamic latch, and
a static driver, with a static output port, operatively driven from the static latch.

2. The combo dynamic flop with scan circuit of claim 1, the scan control circuit further comprising:
a scan master feed-forward circuit operatively driven from the scan latch, wherein the scan master feed-forward circuit provides control signal for writing to the static storage node.

3. The combo dynamic flop with scan circuit of claim 1, wherein a single polarity of the source clock signal is used in the combo dynamic flop with scan circuit.

4. The combo dynamic flop with scan circuit of claim 1, wherein the source clock signal is forced to a low logic state during writing scan data to the dynamic latch storage node.

5. The combo dynamic flop with scan circuit of claim 1, the dynamic latch driver further comprising:
   a keeper device with a first inverter and a second inverter.

6. A semiconductor device comprising:
   a mechanical package; and
   a semiconductor die comprising:
      a semiconductor layer,
      a plurality of metal layers,
      a clock distribution network that distributes a clock signal within the die, and
      a combo dynamic flop with scan circuit, driven by a source clock signal, comprising:
         a flip-flop circuit comprising:
         a dynamic latch circuit comprising:
            a dynamic latch storage node, and
         a static latch circuit comprising:
            a static storage node, and
            wherein the static latch is operatively driven from the dynamic latch,
            wherein the scan clock provides a control signal for writing to the static storage node,
            wherein the dynamic latch and static latch are written simultaneously, and
            wherein the dynamic latch is precharged while scan data is preserved in the static latch until a next clock cycle,
         a scan control circuit comprising:
            a scan slave feed-forward circuit providing a control signal for writing scan data to the static storage node,
            a scan latch circuit comprising:
            a scan feed-back circuit comprising a scan storage node,
            a scan feed-forward circuit operatively driven from the static latch, wherein the scan feed-forward circuit provides control signal for writing to the scan storage node, and
            a scan driver, with a scan output port, operatively driven by the scan feed-back circuit, and
         an output buffer circuit comprising:
            a dynamic latch driver, with a dynamic latch output port, operatively driven from the dynamic latch, and
            a static driver, with a static output port, operatively driven from the static latch.

7. The semiconductor device of claim 6, the scan control circuit further comprising:
   a scan master feed-forward circuit operatively driven from the scan latch, wherein the scan master feed-forward circuit provides control signal for writing to the static storage node.

8. The semiconductor device of claim 6, wherein a single polarity of the source clock signal is used in the combo dynamic flop with scan circuit.

9. The semiconductor device of claim 6, wherein the source clock signal is forced to a low logic state during writing scan data to the dynamic latch storage node.

10. The semiconductor device of claim 6, the dynamic latch driver further comprising:
    a keeper device with a first inverter and a second inverter.

11. A system comprising:
    an input device;
    an output device;
    a mechanical chassis;
    a printed circuit board; and
    a semiconductor device comprising:
       a mechanical package; and
       a semiconductor die comprising:
          a semiconductor layer,
          a plurality of metal layers,
          a clock distribution network that distributes a clock signal within the die, and
          a combo dynamic flop with scan circuit, driven by a source clock signal, comprising:
             a flip-flop circuit comprising:
             a dynamic latch circuit comprising:
                a dynamic latch storage node, and
             a static latch circuit comprising:
                a static storage node, and
                wherein the static latch is operatively driven from the dynamic latch,
                wherein the scan clock provides a control signal for writing to the static storage node,
                wherein the dynamic latch and static latch are written simultaneously, and
                wherein the dynamic latch is precharged while scan data is preserved in the static latch until a next clock cycle,
             a scan control circuit comprising:
                a scan slave feed-forward circuit providing a control signal for writing scan data to the static storage node,
                a scan latch circuit comprising:
                a scan feed-back circuit comprising a scan storage node,
                a scan feed-forward circuit operatively driven from the static latch, wherein the scan feed-forward circuit provides control signal for writing to the scan storage node, and
                a scan driver, with a scan output port, operatively driven by the scan feed-back circuit, and
             an output buffer circuit comprising:
                a dynamic latch driver, with a dynamic latch output port, operatively driven from the dynamic latch, and
                a static driver, with a static output port, operatively driven from the static latch.

12. The system of claim 11, wherein a single polarity of the source clock signal is used in the combo dynamic flop with scan circuit.

13. The system of claim 11, wherein the source clock signal is forced to a low logic state during writing scan data to the dynamic storage node.

14. The system of claim 11, the dynamic latch driver further comprising:
    a keeper device with a first inverter and a second inverter.

* * * * *